United States Patent
Kim et al.

(10) Patent No.: US 11,374,047 B2
(45) Date of Patent: *Jun. 28, 2022

(54) IMAGE SENSOR

(71) Applicant: SAMSUNG ELECTRONICS CO., LTD., Suwon-si (KR)

(72) Inventors: SeungSik Kim, Hwaseong-si (KR); Sungchul Kim, Hwaseong-si (KR); Haeyong Park, Yongin-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

This patent is subject to a terminal disclaimer.

(21) Appl. No.: 16/944,286

(22) Filed: Jul. 31, 2020

(65) Prior Publication Data

US 2020/0365628 A1 Nov. 19, 2020

Related U.S. Application Data

(63) Continuation of application No. 16/124,300, filed on Sep. 7, 2018, now Pat. No. 10,770,499.

(30) Foreign Application Priority Data

Oct. 31, 2017 (KR) .................. 10-2017-0143155

(51) Int. Cl.
*H01L 27/146* (2006.01)
*H04N 5/232* (2006.01)

(52) U.S. Cl.
CPC ...... *H01L 27/1463* (2013.01); *H01L 27/1461* (2013.01); *H01L 27/14603* (2013.01);

(Continued)

(58) Field of Classification Search
CPC ......... H01L 27/14678; H01L 27/14689; H01L 27/14643
See application file for complete search history.

(56) References Cited

U.S. PATENT DOCUMENTS 7,714,263 B2   5/2010  Konishi
8,604,408 B2   12/2013 Yanagita et al.
(Continued)

FOREIGN PATENT DOCUMENTS

JP   2011009463 A   1/2011
JP   2014045217 A   3/2014
(Continued)

*Primary Examiner* — Dale E Page
*Assistant Examiner* — Wilner Jean Baptiste
(74) *Attorney, Agent, or Firm* — Myers Bigel, P.A.

(57) ABSTRACT

An image sensor including a substrate having a first, a first device isolation region adjacent to the first surface and defining a unit pixel, a transfer gate on the first surface at an edge of the unit pixel, a photoelectric conversion part in the substrate and adjacent to a first side surface of the transfer gate, and a floating diffusion region in the substrate and adjacent to a second side surface of the transfer gate. The second side surface faces the first side surface. The first device isolation region is spaced apart from the second side surface. The substrate and the first device isolation region are doped with impurities having a first conductivity. A first impurity concentration of the first device isolation region is greater than a second impurity concentration of the substrate.

12 Claims, 13 Drawing Sheets

(52) U.S. Cl.
CPC .. *H01L 27/14614* (2013.01); *H01L 27/14641* (2013.01); *H01L 27/14643* (2013.01); *H01L 27/14654* (2013.01); *H01L 27/14689* (2013.01); *H01L 27/14621* (2013.01); *H01L 27/14627* (2013.01); *H01L 27/14636* (2013.01); *H04N 5/232122* (2018.08)

(56) References Cited

U.S. PATENT DOCUMENTS

| | | |
|---|---|---|
| 9,159,751 B2 | 10/2015 | Lee et al. |
| 9,461,079 B2 | 10/2016 | Mouli |
| 10,770,499 B2 * | 9/2020 | Kim ................... H01L 27/14654 |
| 2009/0200585 A1 * | 8/2009 | Nozaki ............. H01L 27/14643 257/292 |
| 2014/0217474 A1 | 8/2014 | Lee et al. |
| 2017/0111603 A1 | 4/2017 | Hynecek |
| 2017/0125466 A1 | 5/2017 | Kimura |
| 2017/0170217 A1 | 6/2017 | Yanagita et al. |
| 2018/0301502 A1 | 10/2018 | Lee et al. |

FOREIGN PATENT DOCUMENTS

| | | |
|---|---|---|
| JP | 5564909 B | 8/2014 |
| KR | 20060093385 A | 8/2006 |
| KR | 20090014997 A | 2/2009 |
| KR | 1020140100065 A | 8/2014 |

\* cited by examiner

IMAGE SENSOR

CROSS-REFERENCE TO RELATED APPLICATIONS

This U.S. non-provisional patent application is a continuation of U.S. patent application Ser. No. 16/124,300, filed Sep. 7, 2018, which itself claims priority under 35 U.S.C § 119 to Korean Patent Application No. 10-2017-0143155, filed on Oct. 31, 2017, in the Korean Intellectual Property Office, the disclosure of which is incorporated herein in its entirety by reference.

BACKGROUND

An image sensor is a semiconductor device to transform optical images into electrical signals. The image sensor may be classified into a charge coupled device (CCD) type or a complementary metal oxide semiconductor (CMOS) type. A CIS (CMOS image sensor) refers to a CMOS type image sensor. The CIS may include a plurality of two-dimensionally arranged pixels. Each of the pixels includes a photodiode (PD). The photodiode serves to transform an incident light into an electrical signal.

SUMMARY

Some embodiments of inventive concepts provide an image sensor capable of increasing charge transfer efficiency.

According to some embodiments of inventive concepts, an image sensor includes a substrate having a first surface, a first device isolation region in the substrate and adjacent to the first surface of the substrate, the first device isolation region defining a unit pixel, a transfer gate on the first surface of the substrate at an edge of the unit pixel, a photoelectric conversion part in the substrate and adjacent to a first side surface of the transfer gate, and a floating diffusion region in the substrate and adjacent to a second side surface of the transfer gate, the second side surface of the transfer gate opposing the first side surface of the transfer gate. The first device isolation region may be spaced apart from the second side surface of the transfer gate. The substrate and the first device isolation region may be doped with impurities having a first conductivity. A first impurity concentration of the first device isolation region may be greater than a second impurity concentration of the substrate.

According to some embodiments of inventive concepts, an image sensor may include a substrate having a first surface, a first device isolation region in the substrate and adjacent to the first surface of the substrate, the first device isolation region defining a unit pixel, a sub-isolation region on the unit pixel in the substrate, the sub-isolation region being spaced apart from the first device isolation region and separating the unit pixel into a first sub-pixel and a second sub-pixel, a first sub-transfer gate on the first surface adjacent to a first corner of the first sub-pixel, the first corner of the first sub-pixel being adjacent to the second sub-pixel, a second sub-transfer gate on the first surface of the substrate adjacent to a second corner of the second sub-pixel, the second corner of the second sub-pixel is adjacent to the first sub-transfer gate, and a floating diffusion region in the substrate and adjacent to the first sub-transfer gate and the second sub-transfer gate. The first device isolation region and the sub-isolation region may be spaced apart from the floating diffusion region.

According to some embodiments of inventive concepts, an image sensor may include a substrate having a first surface, a first device isolation region in the substrate and adjacent to the first surface of the substrate, and a first floating diffusion region and a second floating diffusion region spaced apart from each other in the substrate, the first and second floating diffusion regions being adjacent to the first surface. The first device isolation region may define first to fourth unit pixels adjacent to each other arranged in a counterclockwise direction. The first floating diffusion region may be positioned on a boundary between the first unit pixel and the second unit pixel. The second floating diffusion region may be positioned on a boundary between the third unit pixel and the fourth unit pixel. The first and second floating diffusion regions may be electrically connected to each other. The first device isolation region may be spaced apart from the first and second floating diffusion regions.

DETAILED DESCRIPTION OF EMBODIMENTS

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Hereinafter, some embodiments of inventive concepts will be described in detail in conjunction with the accompanying drawings to aid in clearly understanding inventive concepts.

Figure 1:
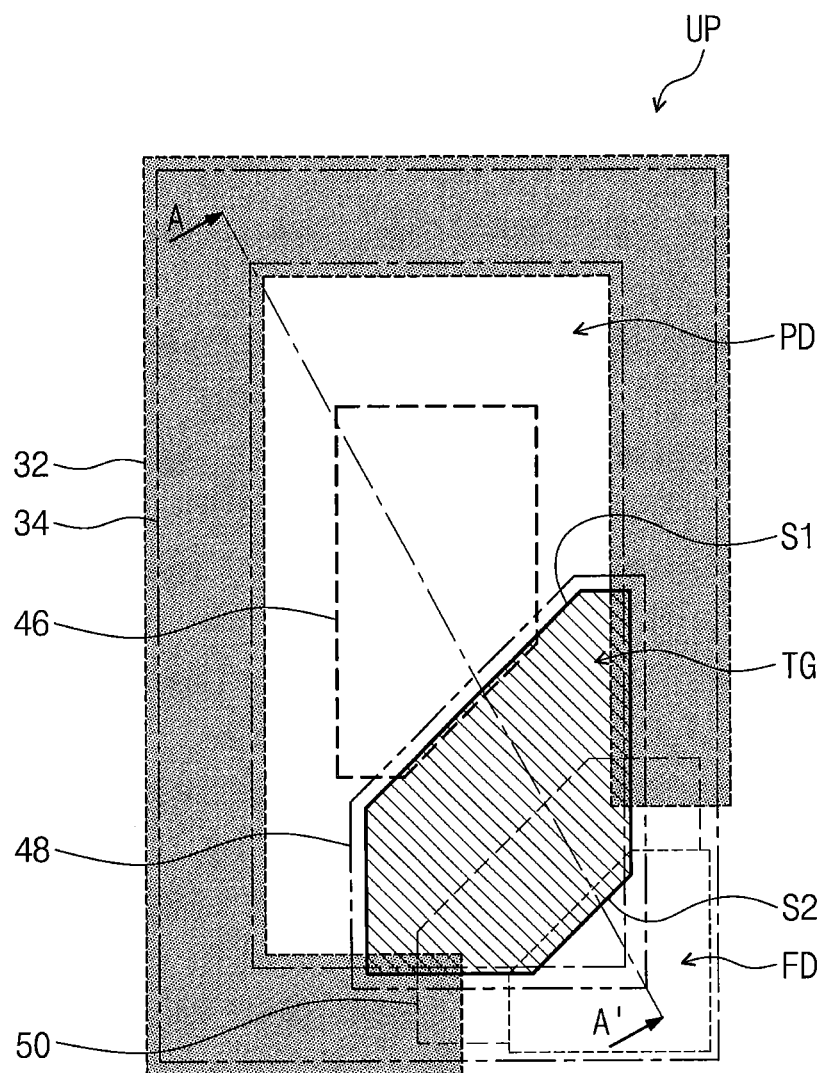
FIG. 1 illustrates a plan view showing an image sensor according to example embodiments of the present inventive concept.
Figure 2:
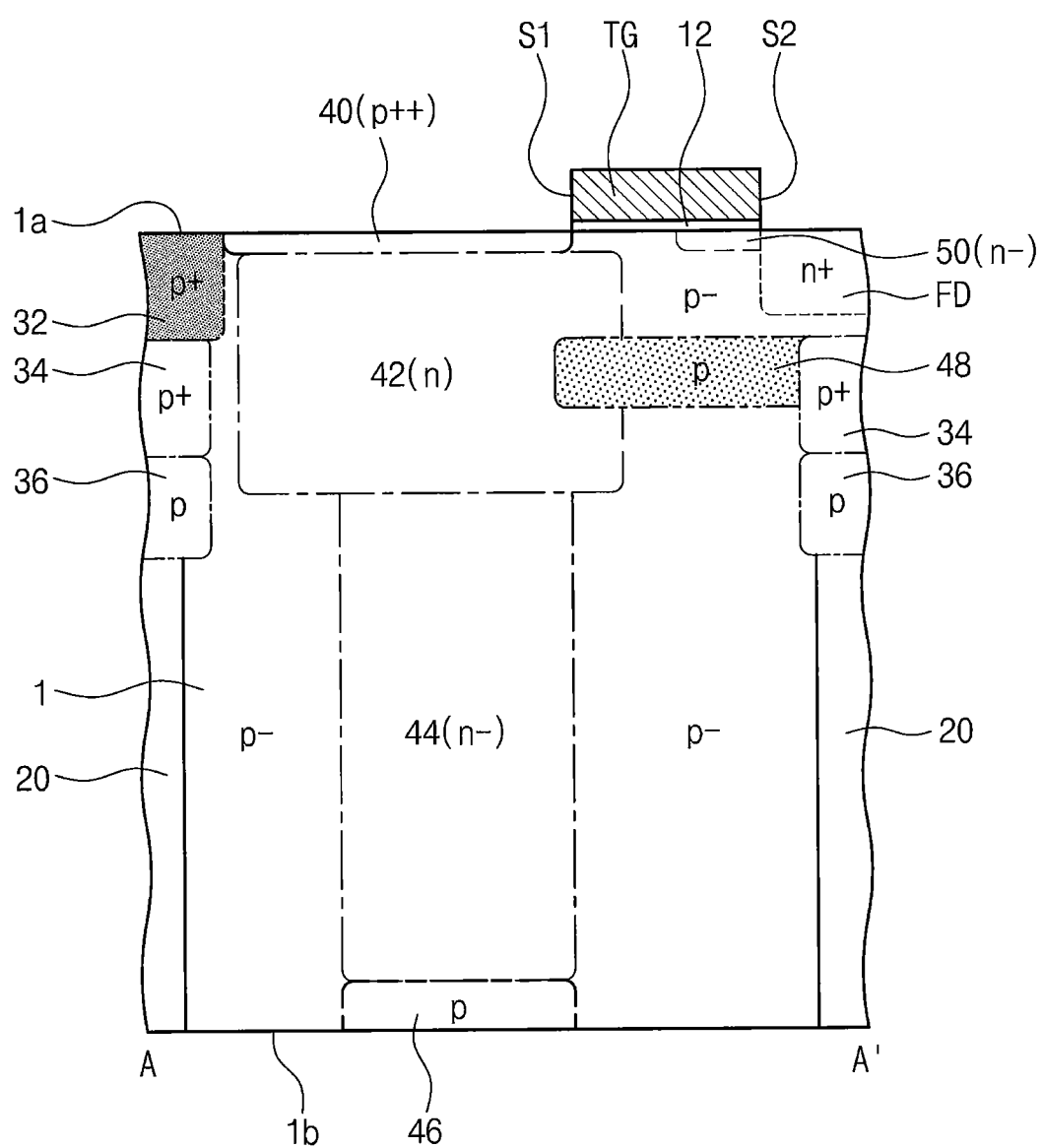
FIG. 2 illustrates a cross-sectional view taken along line A-A' of FIG. 1 according to example embodiments of the present inventive concept.

FIG. 1 illustrates a plan view showing an image sensor according to some embodiments of inventive concepts. FIG. 2 illustrates a cross-sectional view taken along line A-A' of FIG. 1.

Referring to FIGS. 1 and 2, a substrate 1 may be provided to an image sensor of inventive concepts. The substrate 1 may include a plurality of unit pixels UP. FIGS. 1 and 2 illustrate a single unit pixel UP. The substrate 1 may have a first surface 1a and a second surface 1b opposing each other. The substrate 1 may be an epitaxial layer or a single crystalline wafer including silicon or germanium. The substrate 1 may be doped with impurities having a first conductivity. The first conductivity may be P-type conductivity. The impurities having the first conductivity may be or include boron. The substrate 1 may be provided thereon with a first device isolation region 32 confining the unit pixels UP. The first device isolation region 32 may be doped with impurities having the first conductivity. An impurity concentration of the first device isolation region 32 may be greater than that of the substrate 1. The first device isolation region 32 may define an active region of the substrate 1, and the active region may be adjacent to the first surface 1a. The first device isolation region 32 may be intended to separate the unit pixels UP, and may thus require a heavily doped P+ impurity region. The first device isolation region 32 may take the place of a shallow device isolation layer, mitigating dark current possibly occurred when the shallow device isolation layer is formed. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

A transfer gate TG may be disposed on the first surface 1a adjacent to a corner of the unit pixel UP. The transfer gate TG may be formed of a conductive layer such as polysilicon in which metal or impurity is doped. A gate dielectric layer 12 may be interposed between the transfer gate TG and the first surface 1a. The gate dielectric layer 12 may include a silicon oxide layer.

A photoelectric conversion part PD may be disposed in the substrate 1 on the unit pixel UP defined by the transfer gate TG and the first device isolation region 32. The photoelectric conversion part PD may include a first photoelectric conversion region 42 adjacent to the first surface 1a and a second photoelectric conversion region 44 below the first photoelectric conversion region 42. The first photoelectric conversion region 42 and the second photoelectric conversion region 44 may be doped with impurities having a second conductivity opposite to the first conductivity. The second conductivity may be N-type conductivity. The impurities having the second conductivity may be or include phosphorous or arsenic. An impurity concentration of the first photoelectric conversion region 42 may be greater than that of the second photoelectric conversion region 44. A PN junction may be formed between a P-type impurity doped region of the substrate 1 and the first and second photoelectric conversion regions 42 and 44, generating electron-hole pairs when light is incident.

The photoelectric conversion part PD may further include a third photoelectric conversion region 40 between the first photoelectric conversion region 42 and the first surface 1a. The photoelectric conversion part PD may further include a fourth photoelectric conversion region 46 between the second photoelectric conversion region 44 and the second surface 1b. The third photoelectric conversion region 40 and the fourth photoelectric conversion region 46 may be doped with impurities having the first conductivity (e.g., P-type conductivity). An impurity concentration of each of the third and fourth photoelectric conversion regions 40 and 46 may be greater than that of the substrate 1. The impurity concentration of the third photoelectric conversion region 40 may be greater than that of the fourth photoelectric conversion region 46. The third photoelectric conversion region 40 may cause the PN junction to have an area extending toward the first surface 1a. The fourth photoelectric conversion region 46 may cause the PN junction to have an area extending toward the second surface 1b. In this configuration, the PN junction may maximize its area to increase photoelectric conversion efficiency to a maximum.

The transfer gate TG may include a first side surface S1 adjacent to the photoelectric conversion part PD and a second side surface S2 opposing the first side surface S1. A floating diffusion region FD may be disposed in the substrate 1 adjacent to the second side surface S2. The floating diffusion region FD may be adjacent to the first surface 1a. The floating diffusion region FD may be doped with impurities having the second conductivity. An impurity concentration of the floating diffusion region FD may be greater than that of the first photoelectric conversion region 42.

Figure 3:
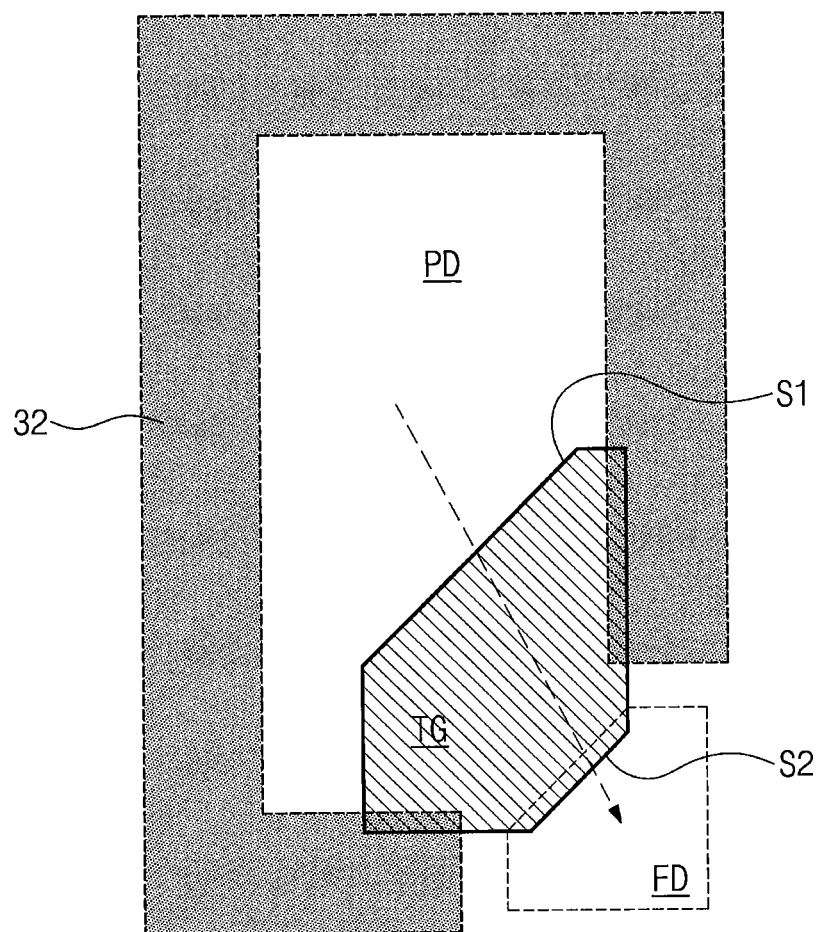
FIG. 3 illustrates a simplified plan view showing a portion of FIG. 1 according to example embodiments of the present inventive concept.
Figure 4:
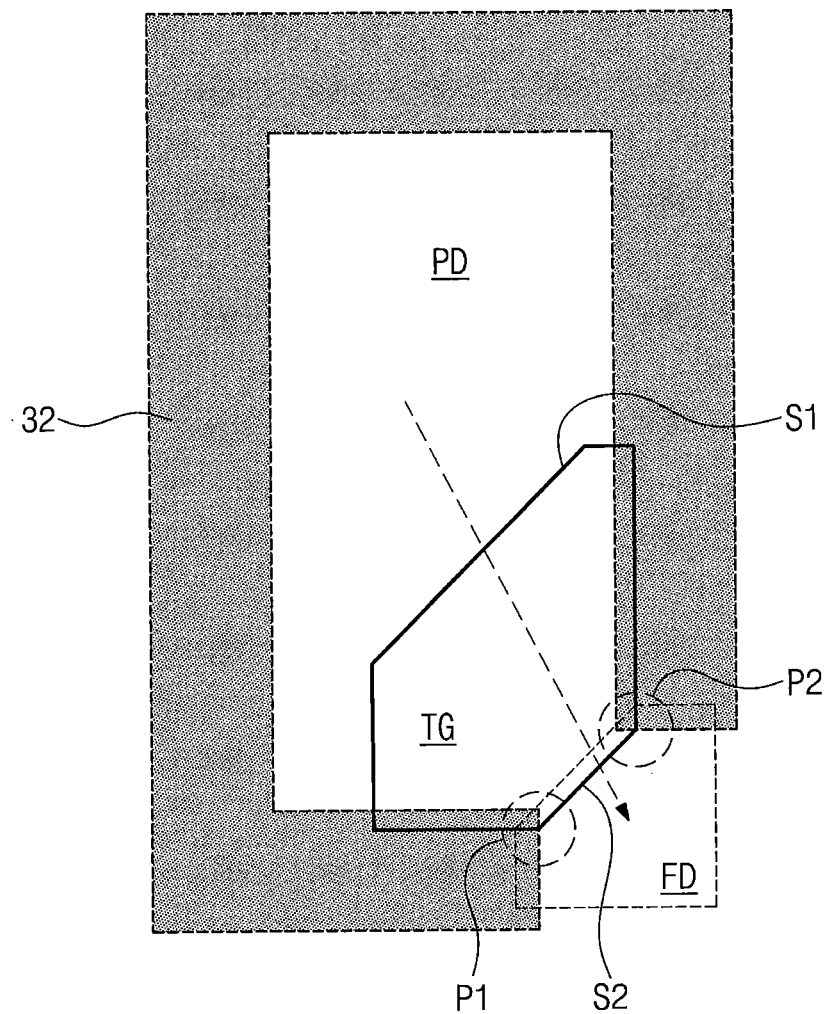
FIG. 4 illustrates a plan view showing the case where a first device isolation region is in contact with a floating diffusion region according to example embodiments of the present inventive concept.

FIG. 3 illustrates a simplified plan view showing a portion of FIG. 1. FIG. 4 illustrates a plan view showing the case where a first device isolation region is in contact with a floating diffusion region.

Referring to FIG. 3, the first device isolation region 32 may be spaced apart from the second side surface S2 of the transfer gate TG. The first device isolation region 32 may be spaced apart from the floating diffusion region FD. When charges are transferred along a dotted arrow from the photoelectric conversion part PD toward the floating diffusion region FD, it may be possible to suppress the effect of the first device isolation region 32 or the heavily doped P-type impurity region. Thus, the transfer gate TG may increase in charge transfer rate. When, as illustrated in FIG. 4, charges are transferred from the photoelectric conversion part PD to the floating diffusion region FD in the case where the first device isolation region 32 extends to reach the second side surface S2 of the transfer gate TG, the heavily doped P-type impurities of the first device isolation region 32 may interrupt the charge transportation at sides (labeled with symbols P1 and P2) of a channel region. As a result, charge transfer rate may decrease and signal detection efficiency may also decrease.

Referring back to FIGS. 1 and 2, a first impurity doped region 50 may be disposed on an upper sidewall of the floating diffusion region FD and below a portion of the transfer gate TG. The first impurity doped region 50 may be spaced apart from the first photoelectric conversion region 42 and the third photoelectric conversion region 40. The first impurity doped region 50 may be doped with, for example, impurities having the second conductivity. An impurity concentration of the first impurity doped region 50 may be less than that of the floating diffusion region FD. The impurity concentration of the first impurity doped region 50 may be less than that of the first photoelectric conversion region 42. Depending on operation of an image sensor, dangling bonds may be formed adjacent to the first surface 1*a*. When charges created in the photoelectric conversion part PD are transferred to the floating diffusion region FD, the dangling bonds may trap the charges. Electrons of N-type impurities doped in the first impurity doped region 50 may be combined with the dangling bonds, thereby removing trap sources. In this sense, the charges may be prevented from being trapped in and recombined with the dangling bonds. Charge loss may then be inhibited when the charges are transferred such that a signal graph may be prevented from being degraded in linearity of low code range. When the impurity concentration of the first impurity doped region 50 is the same as that of the floating diffusion region FD, it may occur a problem that a transfer transistor including the transfer gate TG decreases in OFF potential. Thus, it may be required that the impurity concentration of the first impurity doped region 50 be less than that of the floating diffusion region FD.

A second device isolation region 34 may be disposed in the substrate 1 and below the first device isolation region 32. The second device isolation region 34 may be in contact with the first device isolation region 32. The second device isolation region 34 may be doped with impurities having the first conductivity. An impurity concentration of the second device isolation region 34 may be substantially the same as that of the first device isolation region 32. The second device isolation region 34 may extend to lie below the floating diffusion region FD. Below the floating diffusion region FD, the second device isolation region 34 may prevent the second conductivity impurities of the floating diffusion region FD from diffusing toward the second surface 1*b*. When viewed in plan, the first device isolation region 32 may not form a closed curve, while the second device isolation region 34 may form a closed curve. The first device isolation region 32 may have a layout different from that of the second device isolation region 34, and therefore charge transfer rate may increase.

The substrate 1 may be provided therein with a second impurity doped region 48 overlapping the transfer gate TG. When the transfer gate TG is supplied with voltage, a channel region may be formed in the substrate 1 adjacent to the transfer gate TG. The second impurity doped region 48 may be disposed below the channel region. The second impurity doped region 48 may be spaced apart from the first surface 1*a*. The second impurity doped region 48 may partially extend into the first photoelectric conversion region 42. The second impurity doped region 48 may be doped with impurities having the first conductivity. An impurity concentration of the second impurity doped region 48 may be greater than that of the substrate 1 and less than those of the first and second device isolation regions 32 and 34.

Figure 5:
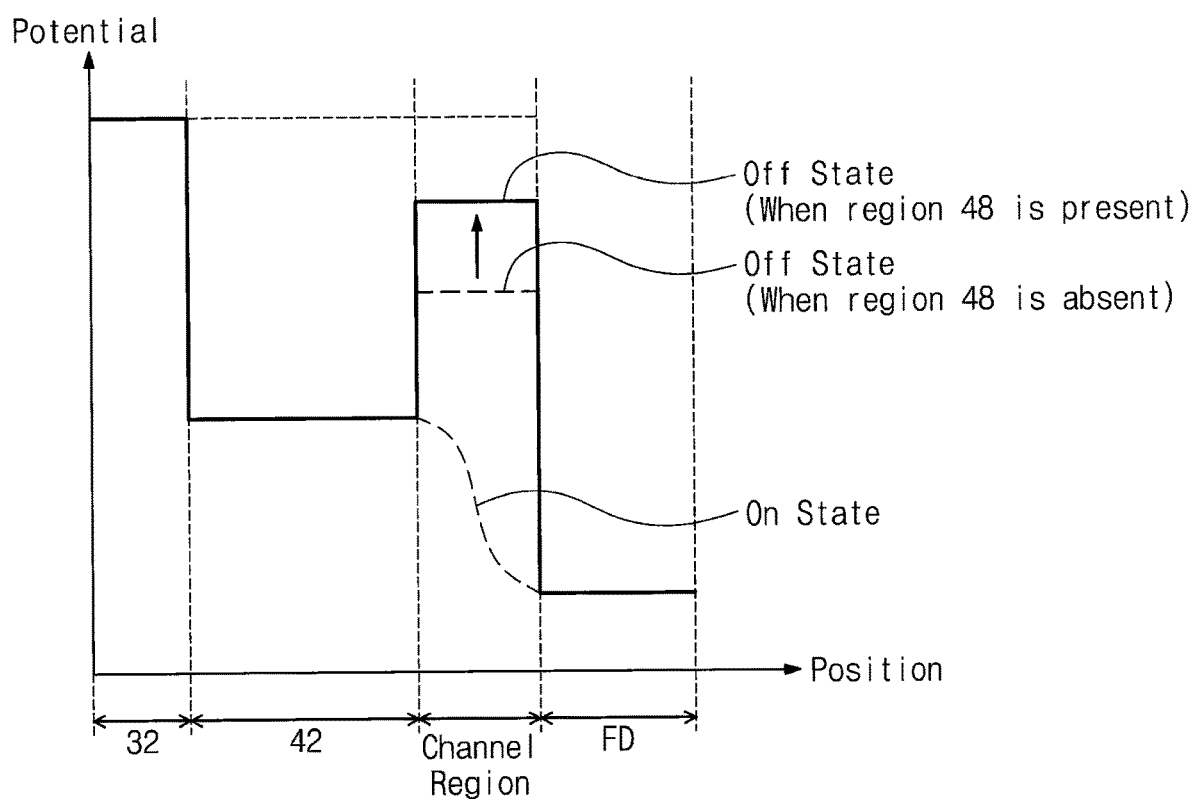
FIG. 5 illustrates a graph of potential versus position for the image sensor of FIG. 2 according to example embodiments of the present inventive concept.

FIG. 5 illustrates a graph of potential versus position for the image sensor of FIG. 2.

Referring to FIGS. 2 and 5, when the transfer transistor including the transfer gate TG is in an off state, the absence of the second impurity doped region 48 may decrease an OFF potential of the channel region, and thus charges created in the photoelectric conversion part PD may be transferred to the floating diffusion region FD even without turning on the transfer gate TG, which may cause problems. When the transfer transistor including the transfer gate TG is in an off state, the second impurity doped region 48 may serve to increase the OFF potential of the channel region (in an arrow direction). As such, when the transfer transistor is in the off state, charges created in the photoelectric conversion part PD may be prevented from being transferred to the floating diffusion region FD. When the impurity concentration of the second impurity doped region 48 is the same as those of the first and second device isolation regions 32 and 34, the OFF potential of the channel region may excessively increase to create a problem such as a blooming phenomenon. If light impinges on a portion of an image sensor, a well region may be filled with generated charge carriers. Light exceeding the capacity of the well region may cause the additional charges to spill into adjacent well regions. This result may be undesirable and may be referred to as a blooming phenomenon. The blooming phenomenon may result in inaccurate data in neighboring pixels, thus reducing spatial resolution of the image sensor system.

Therefore, the impurity concentration of the second impurity doped region 48 may be selected to be less than those of the first and second device isolation regions 32 and 34. A layout of the first device isolation region 32 may be changed to be spaced apart from the floating diffusion region FD, and the impurity concentration of the second impurity doped region 48 may be adjusted independently of that of the first device isolation region 32, with the result that it may be easy to control the OFF potential of the channel region.

A deep device isolation pattern 20 may be disposed between the second device isolation region 34 and the second surface 1*b*. The deep device isolation pattern 20 may be formed of a material having a refractive index different from that of the substrate 1. The deep device isolation pattern 20 may serve to prevent crosstalk between the unit pixels UP. The deep device isolation pattern 20 may include at least a buried insulation layer. The buried insulation layer may be or include, for example, a silicon oxide layer. The deep device isolation pattern 20 may further include a fixed charge layer. The fixed charge layer may be formed of a metal oxide including oxygen whose amount is less than its stoichiometric ratio, or a metal fluoride including fluorine whose amount is less than its stoichiometric ratio. The fixed charge layer may thus have negative fixed charges. The fixed charge layer may be formed of metal oxide or metal fluoride that includes one or more of hafnium (Hf), zirconium (Zr), aluminum (Al), tantalum (Ta), titanium (Ti), yttrium (Y), and lanthanoid. The fixed charge layer may be disposed on an edge of the deep device isolation pattern 20 to come into contact with the substrate 1. In addition, the fixed charge layer may extend to cover the second surface 1*b* of the substrate 1. The fixed charge layer may suppress dark current and white spot.

A third device isolation region 36 may be disposed between the second device isolation region 34 and the deep device isolation pattern 20. The third device isolation region 36 may be doped with impurities having the first conductivity. An impurity concentration of the third device isolation region 36 may be greater than that of the substrate 1 and less than those of the first and second device isolation regions 32 and 34.

Figure 6:
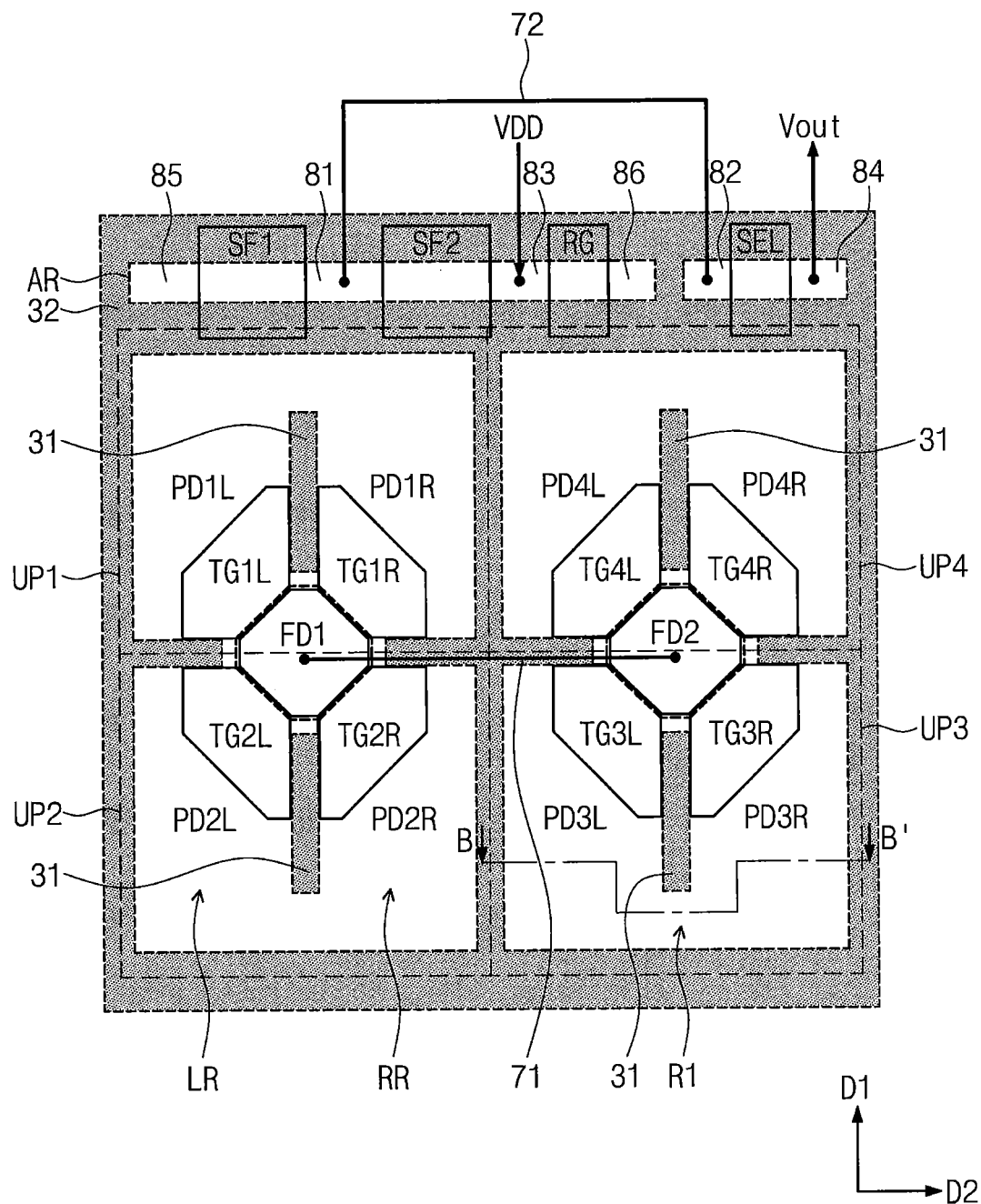
FIG. 6 illustrates a simplified plan view showing an image sensor according to example embodiments of the present inventive concept.

FIG. 6 illustrates a simplified plan view showing an image sensor according to some embodiments of inventive concepts.

Referring to FIG. 6, a first device isolation region 32 may define first to fourth unit pixels UP1, UP2, UP3, and UP4 that neighbor with each other. The first to fourth unit pixels UP1 to UP4 may be adjacent to each other along a counterclockwise direction. For example, the first unit pixel UP1 and the second unit pixel UP2 may be disposed adjacently in a first direction D1. The first unit pixel UP1 and the fourth unit pixel UP4 may be disposed adjacently in a second direction D2 intersecting and/or perpendicular to the first direction D1. The second unit pixel UP2 and the third unit pixel UP3 may be disposed adjacently in the second direction D2. Although not shown, each of the first to fourth unit pixels UP1 to UP4 may be provided with one micro-lens into which light is incident.

Sub-isolation regions 31 may be disposed on centers of the first to fourth unit pixels UP1 to UP4. The sub-isolation region 31 may separate each of the first to fourth unit pixels UP1 to UP4 into a left sub-pixel LR and a right sub-pixel RR. The left sub-pixels LR may be provided with first to fourth left sub-photoelectric conversion parts PD1L, PD2L, PD3L, and PD4L and first to fourth left sub-transfer gates TG1L, TG2L, TG3L, and TG4L. The right sub-pixels RR may be provided with first to fourth right sub-photoelectric conversion parts PD1R, PD2R, PD3R, and PD4R and first to fourth right sub-transfer gates TG1R, TG2R, TG3R, and TG4R. A single micro-lens may be shared by the left sub-pixel LR and the right sub-pixel RR that constitute one unit pixel such as UP1, UP2, UP3, or UP4.

A first floating diffusion region FD1 may be disposed on the middle of a boundary between the first unit pixel UP1 and the second unit pixel UP2. A second floating diffusion region FD2 may be disposed on the middle of a boundary between the third unit pixel UP3 and the fourth unit pixel UP4. The first floating diffusion region FD1 may be commonly adjacent to the first left and right sub-transfer gates TG1L and TG1R and the second left and right sub-transfer gates TG2L and TG2R. The second floating diffusion region FD2 may be commonly adjacent to the third left and right sub-transfer gates TG3L and TG3R and the fourth left and right sub-transfer gates TG4L and TG4R. The first floating diffusion region FD1 and the second floating diffusion region FD2 may be electrically connected to each other through a first line 71.

Similarly to the first device isolation region 32 discussed above with reference to FIGS. 1 and 2, the first device isolation region 32 and the sub-isolation regions 31 may be heavily doped P-type impurity regions disposed in the substrate 1. The first device isolation region 32 and the sub-isolation regions 31 may be located at the same level in the substrate 1. The first device isolation region 32 and the sub-isolation regions 31 may all be spaced apart from the first and second floating diffusion regions FD1 and FD2. In such a configuration, the left sub-transfer gates TG1L, TG2L, TG3L, and TG4L and/or the right sub-transfer gates TG1R, TG2R, TG3R, and TG4R may increase in charge transfer rate. The first device isolation region 32 and the sub-isolation regions 31 may not be formed at the first and second floating diffusion regions FD1 and FD2, and therefore it may be possible to exclude the effect of the heavily doped P-type impurities.

The sub-isolation regions 31 may not be in contact with, but may be spaced apart from the first device isolation region 32. Between the first to fourth left sub-photoelectric conversion parts PD1L to PD4L and the first to fourth right sub-photoelectric conversion parts PD1R to PD4R, respectively, a first region R1 between the sub-isolation region 31 and the first device isolation region 32 may have a potential less than that of the first device isolation region 32. The first region R1 may have an impurity concentration lower than that of the first device isolation region 32.

Figure 7:
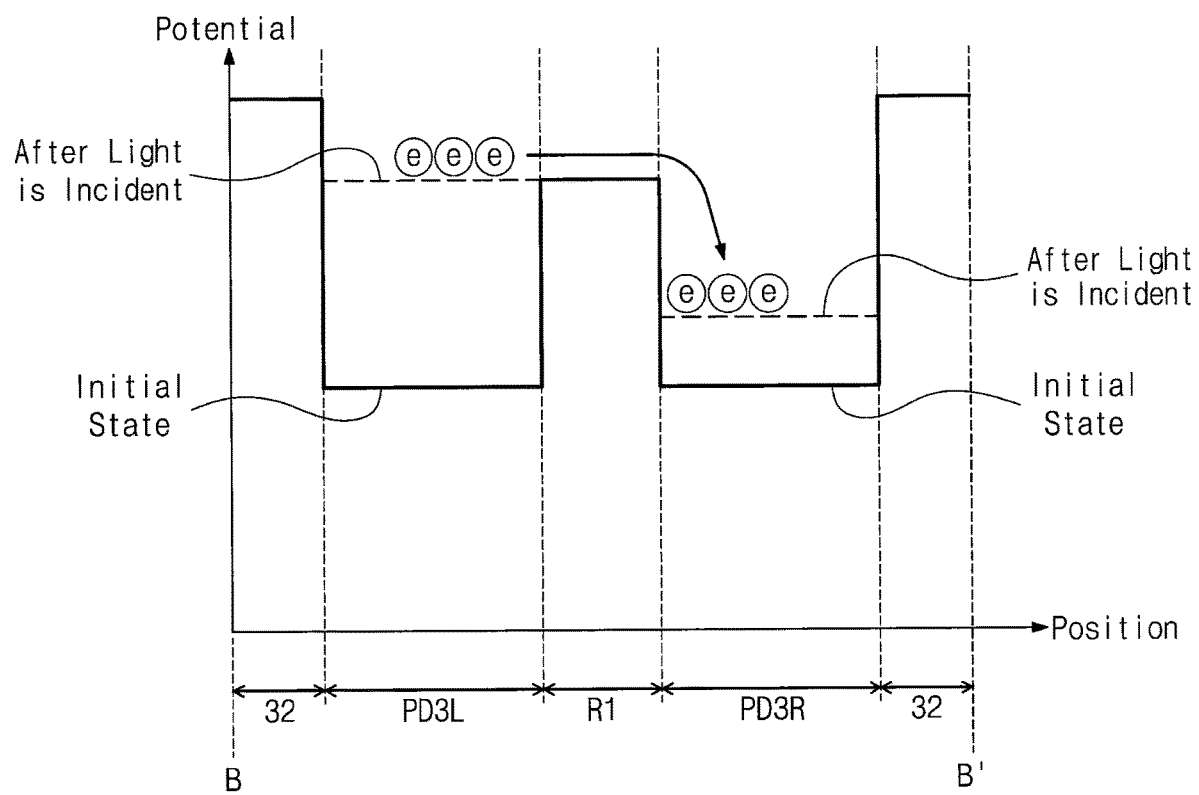
FIG. 7 illustrates a graph of potential versus position for a cross-section taken along line B-B' of FIG. 6 according to example embodiments of the present inventive concept.

The third unit pixel UP3 will be representatively discussed below. FIG. 7 illustrates a graph of potential versus position for a cross-section taken along line B-B' of FIG. 6.

Referring to FIG. 7, between the third left sub-photoelectric conversion part PD3L and the third right sub-photoelectric conversion part PD3R, the potential of the first region R1 between the sub-isolation region 31 and the first device isolation region 32 may be less than that of the first device isolation region 32. When light is incident onto the third unit pixel UP3, each of the third left sub-photoelectric conversion part PD3L and the third right sub-photoelectric conversion part PD3R may have an increased potential. The third left sub-photoelectric conversion part PD3L and the third right sub-photoelectric conversion part PD3R may be different from each other in terms of the degree of increase in potential, based on an amount of light received. For example, the potential of the third left sub-photoelectric conversion part PD3L may become greater than that of the third right sub-photoelectric conversion part PD3R. When the potential of the third left sub-photoelectric conversion part PD3L becomes greater than that of the third right sub-photoelectric conversion part PD3R, electrons may migrate into the third right sub-photoelectric conversion part PD3R having a relatively low potential. Therefore, the blooming phenomenon may be prevented since the third right sub-photoelectric conversion part PD3L electron capacity may not be exceeded. When the sub-isolation region 31 is in contact with the first device isolation region 32 under the condition where the first region R1 is absent, charges excessively created in the third left sub-photoelectric conversion part PD3L may migrate into a neighboring first unit pixel UP1 after passing over the first device isolation region 32, thereby creating the blooming phenomenon.

Figure 8:
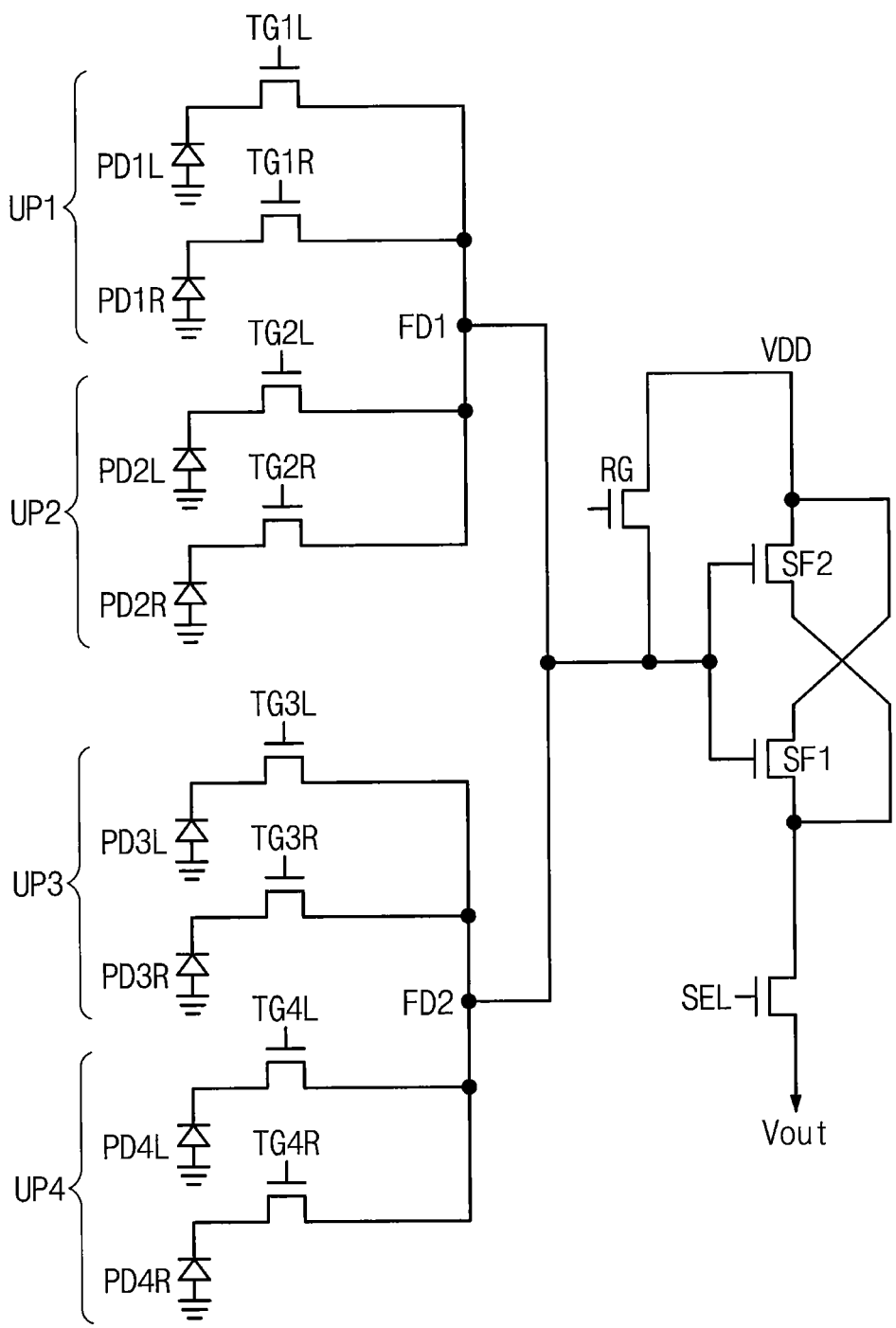
FIG. 8 illustrates a circuit diagram showing the image sensor of FIG. 6 according to example embodiments of the present inventive concept.

FIG. 8 illustrates a circuit diagram of the image sensor shown in FIG. 6.

Referring to FIGS. 6 and 8, the first device isolation region 32 may extend to define active regions AR for transistors that drive an image sensor. For example, the active region AR adjacent to the first unit pixel UP1 may be provided thereon with first and second source follower gates SF1 and SF2 spaced apart from each other. The active regions AR adjacent to the fourth unit pixel UP4 may be provided thereon with a reset gate RG and a select gate SEL spaced apart from each other. The substrate 1 may be provided therein with source/drain regions 81, 82, 83, 84, 85, and 86 on opposite sides of the first source follower gate SF1, the second source follower gate SF2, the reset gate RG, and the select gate SEL. A first source/drain region 81 between the first and second follower gates SF1 and SF2 may be electrically connected through a second line 72 to a second source/drain region 82 adjacent to a side of the select gate SEL. A power voltage VDD may be applied to a third source/drain region 83 between the second source follower gate SF2 and the reset gate RG. A signal may be detected from a fourth source/drain region 84 adjacent to other side of the select gate SEL. A fifth source/drain region 85 may lie adjacent to a side of the first source follower gate SF1. A sixth source/drain region 86 may lie adjacent to a side of the reset gate RG.

The first and second source follower gates SF1 and SF2 may form a fingered type source follower transistor. The first and second source follower gates SF1 and SF2 may be electrically connected to each other through a line not shown in figures. The first source/drain region 81 may correspond to a common drain region between the first and second source follower gates SF1 and SF2. The fifth and third source/drain regions 85 and 83 corresponding to source regions of the first and second source follower gates SF1 and SF2 may be electrically connected to each other through a line not shown in figures.

The source follower transistor may have a function of receiving a potential of a floating diffusion region, which serves as a sensing node, via a gate to amplify the potential of the floating diffusion region, and of transmitting the amplified potential to an internal circuit. Compared to other transfer, reset, and select transistors, the source follower transistor may be far more vulnerable to intrinsic noises of transistor, such as thermal noise and flicker noise. The noise occurred at the source follower transistor may be transferred to the internal circuit, and thus image quality may deteriorate. As the source follower transistor is formed to have the fingered type, it may be beneficial to reduce the effect of intrinsic thermal and flicker noises of transistor, and to faithfully read potentials of the first and second floating diffusion regions FD1 and FD2.

Charges created in the first to fourth unit pixels UP1 to UP4 may be sequentially transferred. First, the power voltage VDD may be applied to a drain of a rest transistor including the reset gate RG and to a drain of the source follower transistor including the first and second source follower gates SF1 and SF2, and thus the first and second floating diffusion regions FD1 and FD2 may discharge charges remaining therein. Thereafter, the reset transistor may be turned off, and light may be received. A voltage may be applied to the first left and right sub-transfer gates TG1L and TG1R, and then charges created in the first left and right sub-photoelectric conversion parts PD1L and PD1R may be transferred to and accumulated in the first floating diffusion region FD1. Biases of the first and second source follower gates SF1 and SF2 may be changed in proportion to the accumulated amount of charges, and thus a source potential of the source follower transistor may be changed. In this case, when a select transistor including the select gate SEL is turned on, a signal by charges may be read out of a signal readout line Vout. Successively, the same operation may be performed on the second to fourth unit pixels UP2 to UP4.

The first left and right sub-transfer gates TG1L and TG1R may be supplied with a turn-on voltage at the same time as discussed above or in sequence. For example, one of the first left and right sub-transfer gates TG1L and TG1R may be supplied with the turn-on voltage to detect a signal of a relevant sub-pixel, and thereafter the other of the first left and right sub-transfer gates TG1L and TG1R may be supplied with the turn-on voltage to detect a signal of other sub-pixel.

Figure 9:
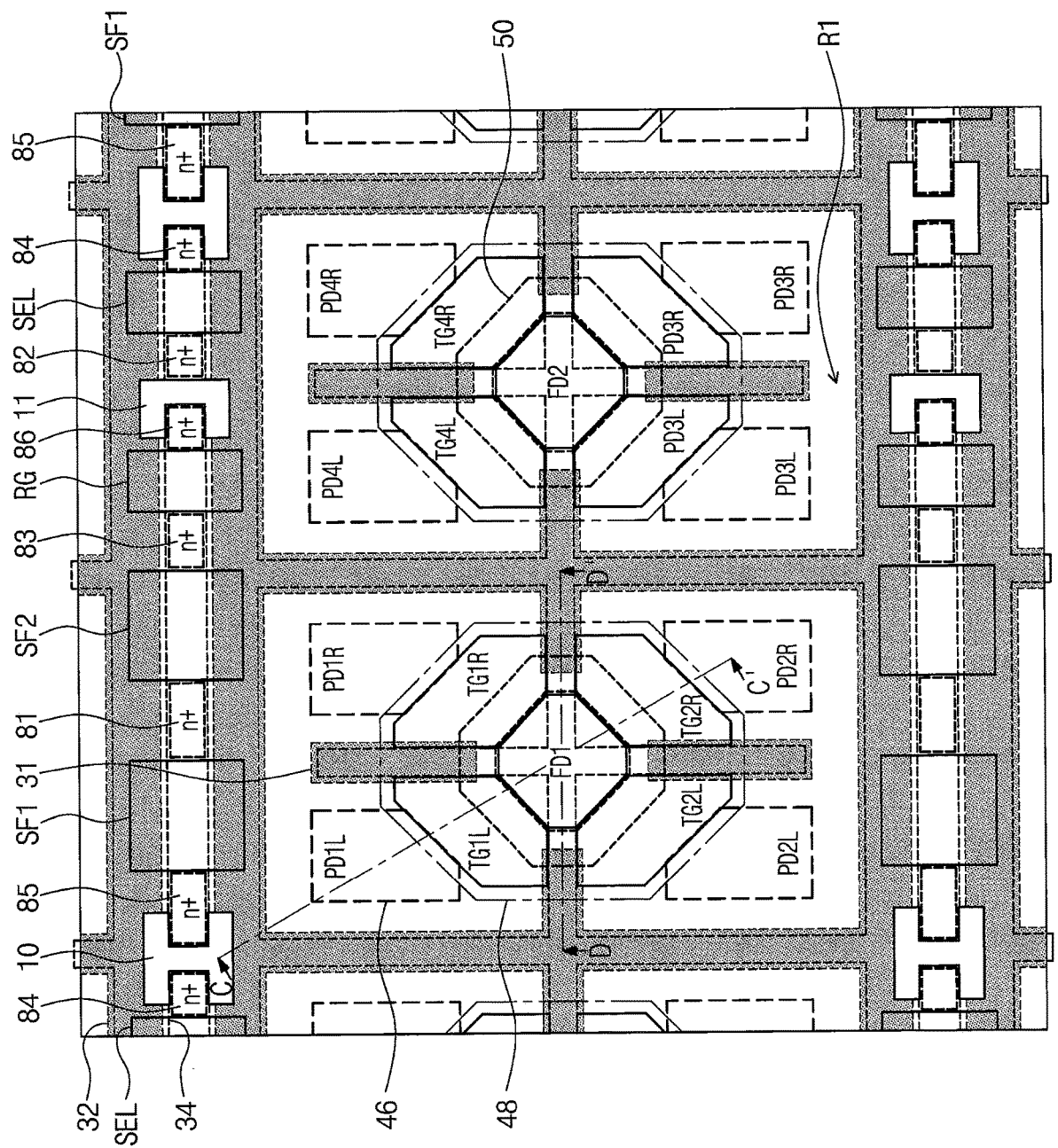
FIG. 9 illustrates a detailed plan view showing an image sensor according to example embodiments of the present inventive concept.
Figure 10:
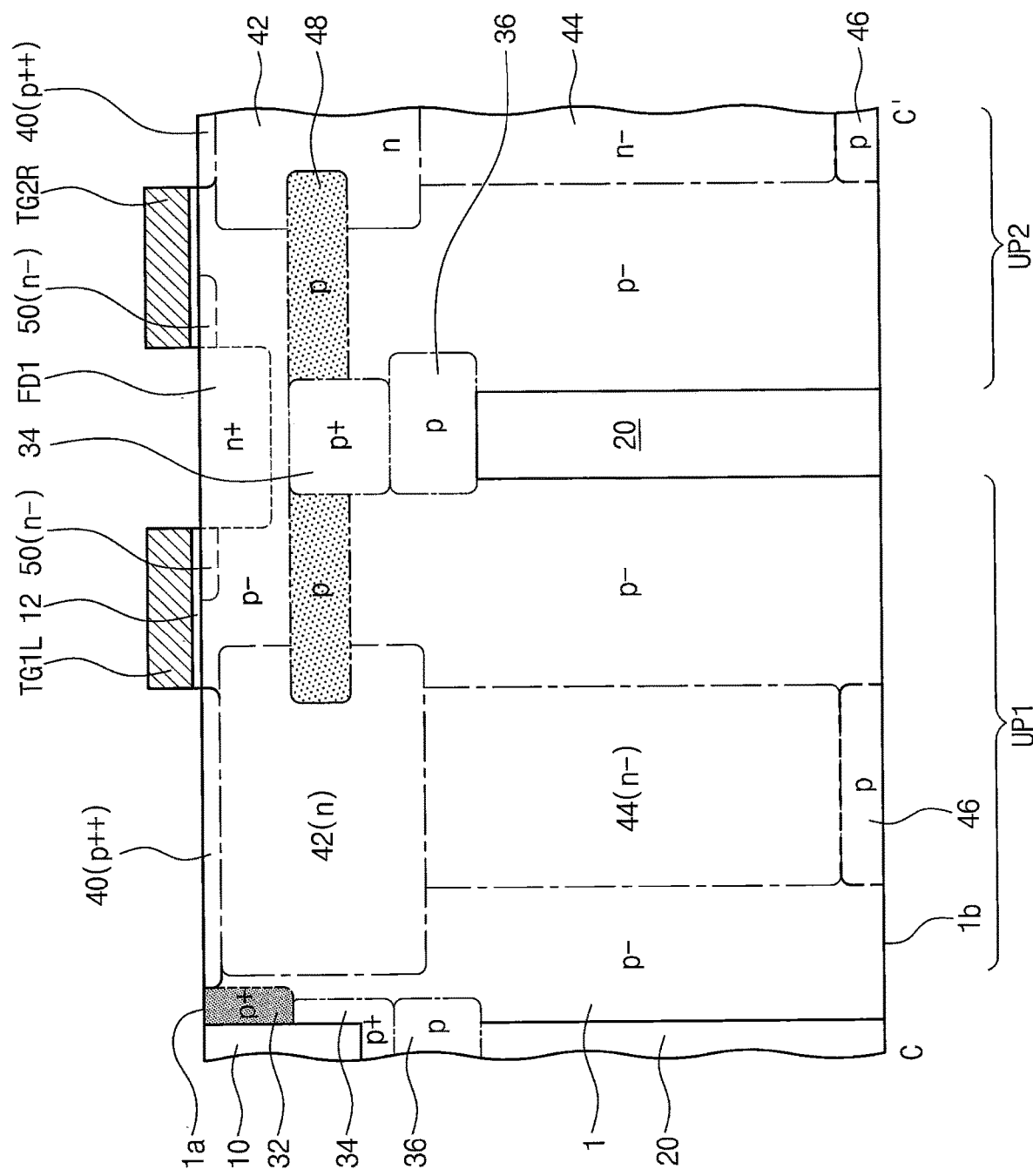
FIG. 10 illustrates a cross-sectional view taken along line C-C' of FIG. 9 according to example embodiments of the present inventive concept.
Figure 11:
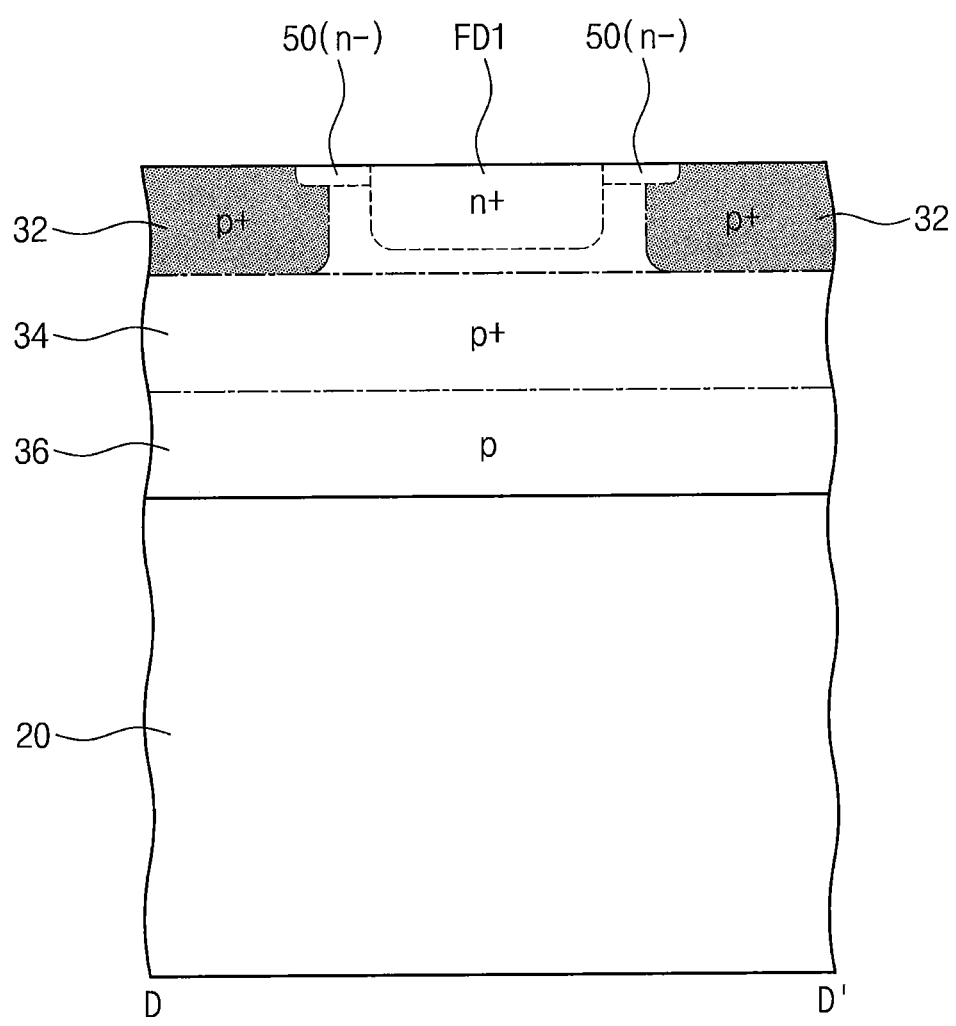
FIG. 11 illustrates a cross-sectional view taken along line D-D' of FIG. 9 according to example embodiments of the present inventive concept.

FIG. 9 illustrates a detailed plan view showing an image sensor according to some embodiments of inventive concepts. FIG. 10 illustrates a cross-sectional view taken along line C-C' of FIG. 9. FIG. 11 illustrates a cross-sectional view taken along line D-D' of FIG. 9.

Referring to FIGS. 9 to 11, the first to sixth source/drain regions 81 to 86 may all be a region where impurities having the second conductivity are doped. An impurity concentration of each of the first to sixth source/drain regions 81 to 86 may be the same as those of the first and second floating diffusion regions FD1 and FD2. Shallow device isolation patterns 10 and 11 may be disposed between neighboring heavily doped N+ impurity regions, and may electrically separate the neighboring heavily doped N+ impurity regions from each other. For example, a first shallow device isolation pattern 10 may be disposed between the fourth source/drain region 84 and the fifth source/drain region 85 that neighbor with each other. A second shallow device isolation pattern 11 may be disposed between the second source/drain region 82 and the sixth source/drain region 86 that neighbor with each other. The shallow device isolation patterns 10 and 11 may be formed of, for example, a silicon oxide layer.

The first device isolation region 32 and the second device isolation region 34 may be in contact with side and bottom surfaces of the shallow device isolation patterns 10 and 11. The shallow device isolation patterns 10 and 11 may be formed by, for example, a shallow trench isolation (STI) process. The shallow device isolation patterns 10 and 11 may have on their surfaces crystal defects caused by etching damages. Therefore, dangling bonds may be present on the surfaces of the shallow device isolation patterns 10 and 11. The dangling bonds may create electrons, increasing dark current. Since the first device isolation region 32 and the second device isolation region 34 are in contact with the side and bottom surfaces of the shallow device isolation patterns 10 and 11, the dark current may be reduced.

The first impurity doped region 50 may partially overlap corresponding ones of the left sub-transfer gates TG1L, TG2L, TG3L, and TG4L and corresponding ones of the right sub-transfer gates TG1R, TG2R, TG3R, and TG4R. Referring to FIGS. 9 and 11, the first impurity doped region 50 may partially extend into the first device isolation region 32 and the sub-isolation region 31. The second impurity doped region 48 may entirely overlap corresponding ones of the left sub-transfer gates TG1L, TG2L, TG3L, and TG4L and corresponding ones of the right sub-transfer gates TG1R, TG2R, TG3R, and TG4R. The second impurity doped region 48 may partially extend into the first photoelectric conversion regions 42 of corresponding ones of the sub-photoelectric conversion parts PD1L to PD4L and PD1R to PD4R. The second device isolation region 34 may have a cross shape below the first and second floating diffusion regions FD1 and FD2. Since the first and second device isolation regions 32 and 34 heavily doped with P-type impurities are not formed at the first region R1, the effect discussed above with reference to FIG. 7 may be accomplished, thus reducing or preventing the blooming phenomenon. The first region R1 may be provided with the deep device isolation pattern 20 such as the third device isolation region 36 where P-type impurities are relatively lightly doped compared to the first and second device isolation regions 32 and 34. The deep device isolation pattern 20 may extend between the second device isolation region 34 and the second surface 1b. The deep device isolation pattern 20 adjacent to the second surface 1b may have a network shape. The deep device isolation pattern 20 may separate the sub-pixels as well as the unit pixels. Other configurations and effects may be identical or similar to those discussed with reference to FIGS. 1 to 8.

Although not shown, the first surface 1a may be covered with a plurality of interlayer dielectric layers. The plurality of interlayer dielectric layers may be provided therein with various routing lines including the lines 71 and 72 discussed with reference to FIG. 6, and therefore the circuit of FIG. 8 may be fabricated. A fixed charge layer may be disposed on the second surface 1b. A color filter and a micro-lens may be disposed either on the first surface 1a or on the second surface 1b.

According to inventive concepts, for the pixel separation, a layout of the first device isolation region 32 where P-type impurities are heavily doped may be changed to be spaced apart from the floating diffusion region FD such that the channel region may not be affected by the first device isolation region 32. Consequently, charge transfer rate may increase.

The following describes a method of manufacturing an image sensor discussed with reference to FIGS. 9 to 11.

The substrate 1 may be provided to include first conductivity impurities doped therein. Ion implantation processes may be performed to form, in the substrate 1, the left and right sub-photoelectric conversion parts PD1L to PD4L and PD1R to PD4R, the first to third device isolation regions 32, 34, and 36, and the first and second impurity doped regions 50 and 48. A shallow trench isolation (STI) method may be employed to form the shallow device isolation pattern 10 adjacent to the first surface 1a of the substrate 1. The gate dielectric layer 12, the sub-transfer gates TG1L to TG4L and TG1R to TG4R, the source follower gates SF1 and SF2, the reset gate RG, and the select gate SEL may be formed on the first surface 1a. An ion implantation process may be performed to form the floating diffusion regions FD1 and FD2 and the source/drain regions 81 to 86 where N-type impurities are heavily doped. Although not shown, one or more interlayer dielectric layers and lines may be formed, and then the substrate 1 may be turned upside down. The deep device isolation pattern 20 may be formed adjacent to the second surface 1b.

An image sensor according to some embodiments of inventive concepts may be applicable to various type image sensors. For example, the image sensor discussed with reference to FIGS. 6 and 8 to 11 may be applicable to an autofocus image sensor.

Figure 12:
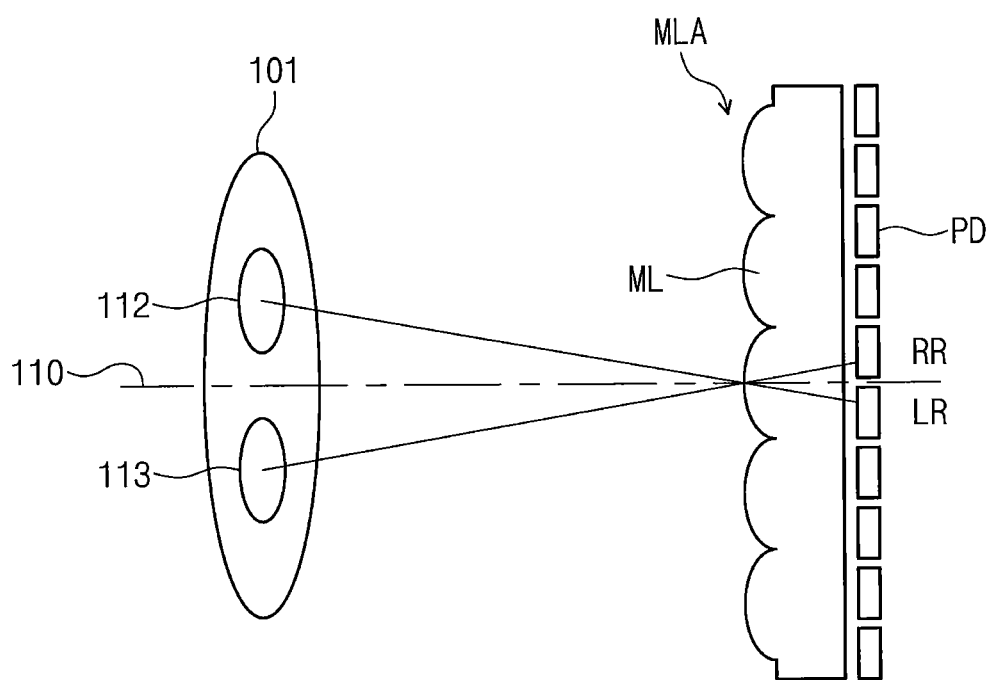
FIG. 12 illustrates a schematic diagram showing a principle of phase difference autofocus (AF) using an autofocus image sensor according to example embodiments of the present inventive concept.
Figure 13A:
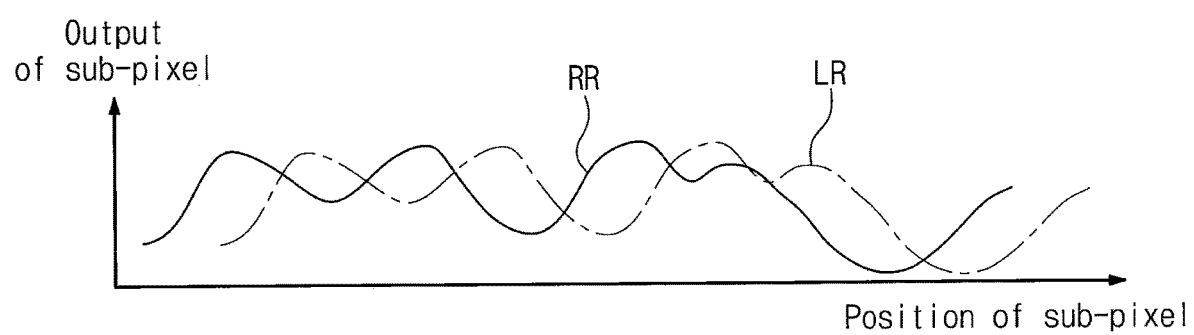
FIG. 13A illustrates a graph showing phases of output values of sub-pixels LR and RR when focal points are inconsistent with each other according to example embodiments of the present inventive concept.
Figure 13B:
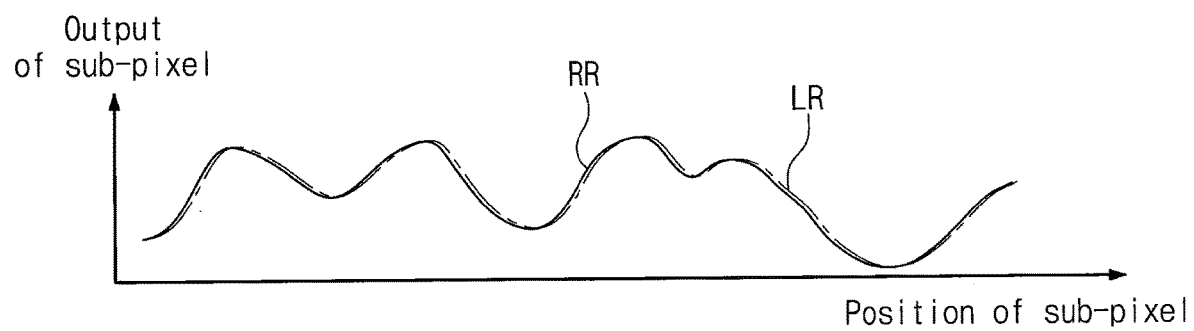
FIG. 13B illustrates a graph showing phases of output values of sub-pixels LR and RR when focal points are

FIG. 12 illustrates a schematic diagram showing a principle of phase difference autofocus (AF) using an autofocus image sensor. FIG. 13A illustrates a graph showing phases of output values of sub-pixels LR and RR when focal points are inconsistent with each other. FIG. 13B illustrates a graph showing phases of output values of sub-pixels LR and RR when focal points are consistent with each other.

Referring to FIG. 12, an object light that has transmitted through an imaging lens 101 may be guided into a right sub-pixel RR and a left sub-pixel LR after passing through a micro-lens array MLA. For example, among optical apertures 112 and 113 of the imaging lens 101, light from the optical aperture 112 above an optical axis 110 of the imaging lens 101 may be incident onto the left sub-pixel LR, and light from the optical aperture 113 below the optical axis 110 of the imaging lens 101 may be incident onto the right sub-pixel RR. As discussed above, the right sub-pixel RR and the left sub-pixel LR may share one micro-lens ML. For example, the right sub-pixel RR and the left sub-pixel LR may form one unit pixel UP, and the photoelectric conversion part PD may be provided on each of the sub-pixels LR and RR. On the unit pixel UP, the photoelectric conversion parts PD may be spaced apart from each other when viewed in plan, and lights incident onto the photoelectric conversion parts PD may have different phases from each other. A phase difference between images obtained in the photoelectric conversion parts PD may be detected to correct a focus of the obtained image.

FIGS. 13A and 13B may plot values continuously output from the right sub-pixels RR and the left sub-pixel LR along the micro-lens array MLA. In FIGS. 13A and 13B, a horizontal axis may denote positions of the right sub-pixel RR and the left sub-pixel LR, and a vertical axis may denote the output values of the right sub-pixel RR and the left sub-pixel LR. The output values of the right sub-pixels RR and the left sub-pixels LR may exhibit the same shape. On the other hand, the output values of the right sub-pixels RR and the left sub-pixels LR may differ in position, or phase. This may be due to a difference in positions where images are produced by lights from the eccentrically arranged optical apertures 112 and 113 of the imaging lens 101. Thus, when focal points of lights are inconsistent with each other, the right and left sub-pixels RR and LR may exhibit different phases as illustrated in FIG. 13A, while when focal points of lights are consistent with each other, the images may be formed at the same position as illustrated in FIG. 13B. In addition, a direction of focus difference may be determined from the mentioned above. A focused position ahead of an object may be called a front-focusing, and in the case of the front-focusing, the phase of the output of the right sub-pixel RR may be shifted to the left from that of a focused state, and the phase of the output of the left sub-pixel LR may be shifted to the right from that of the focused state. In contrast, a focused position behind an object may be called a back-focusing, and in the case of the back-focusing, the phase of the output of the right sub-pixel RR may be shifted to the right from that of a focused state, and the phase of the output of the left sub-pixel LR may be shifted to the left from that of the focused state. The shift amount between the phases of the output values of the right sub-pixels RR and the left sub-pixels LR may be converted into a deviation amount between the focuses.

An autofocus image sensor according to some embodiments of inventive concepts may not include a separate pixel (not shown) for focus detection. The focus detection pixel may have a function to correct a focus of the unit pixel UP, but not to output an object image. The increase in number of the focus detection pixels may reduce the number of the unit pixels UP that output an electrical signal. The absence of the focus detection pixel may improve resolution of the autofocus image sensor.

An image sensor according to some embodiments of inventive concepts may suppress the blooming phenomenon, improve the dark current characteristics, and/or increase the charge transfer efficiency.

As used herein, the term "and/or" includes any and all combinations of one or more of the associated listed items. Expressions such as "at least one of," when preceding a list of elements, modify the entire list of elements and do not modify the individual elements of the list.

As described above, the exemplary embodiments have been described with reference to the drawings and the specification. Although the embodiments have been described using specific terms in the specification, these terms are used to describe the technical idea of the present disclosure but are not used to limit the meaning or limit the scope of the present disclosure in the claims. While the inventive concepts have been particularly shown and described with reference to embodiments thereof, it will be understood that various changes in form and details may be made therein without departing from the spirit and scope of the following claims.

What is claimed is:
1. An image sensor, comprising:
a substrate having a first surface;
a first device isolation region in the substrate and adjacent to the first surface of the substrate, the first device isolation region defining a unit pixel;
a transfer gate on the first surface of the substrate at an edge of the unit pixel;
a photoelectric conversion part in the substrate and adjacent to a first side surface of the transfer gate; and a floating diffusion region in the substrate and adjacent to a second side surface of the transfer gate, the second side surface opposing the first side surface, a second device isolation region in the substrate below the floating diffusion region and doped with impurities having a first conductivity, wherein the first device isolation region is spaced apart from the second side surface of the transfer gate, wherein the substrate and the first device isolation region are doped with impurities having the first conductivity, wherein a first impurity concentration of the first device isolation region is greater than a second impurity concentration of the substrate, and wherein a third impurity concentration of the second device isolation region is equal to the first impurity concentration of the first device isolation region.

2. The image sensor of claim 1, wherein the second device isolation region contacts the first device isolation region.

3. The image sensor of claim 1, wherein the first device isolation region is spaced apart from the floating diffusion region.

4. The image sensor of claim 1, further comprising:
a first impurity doped region in the substrate and overlapping the transfer gate,
wherein the photoelectric conversion part comprises a first photoelectric conversion region doped with impurities having a second conductivity opposite to the first conductivity, and
wherein the first impurity doped region extends into the first photoelectric conversion region.

5. The image sensor of claim 4,
wherein the photoelectric conversion part further comprises a second photoelectric conversion region in the substrate and adjacent to a second surface of the substrate that is opposite to the first surface of the substrate, and
wherein the second photoelectric conversion region overlaps the first photoelectric conversion region and is doped with impurities having the first conductivity.

6. The image sensor of claim 5,
wherein the photoelectric conversion part further comprises a third photoelectric conversion region between the first photoelectric conversion region and the second photoelectric conversion region,
wherein the third photoelectric conversion region is doped with impurities having the second conductivity, and
wherein a fourth impurity concentration of the third photoelectric conversion region is less than a fifth impurity concentration of the first photoelectric conversion region.

7. The image sensor of claim 1, further comprising:
a deep device isolation pattern extending from a second surface of the substrate that is opposite to the first surface of the substrate towards the first surface of the substrate and overlapping the first device isolation region and/or the floating diffusion region.

8. The image sensor of claim 1, further comprising:
a shallow device isolation pattern extending from the first surface of the substrate towards a second surface of the substrate that is opposite to the first surface of the substrate and in contact with the first device isolation region.

9. The image sensor of claim 8, further comprising:
a first source/drain region and a second source/drain region adjacent to each other in the substrate, wherein the shallow device isolation pattern is spaced apart from the unit pixel and is between the first source/drain region and the second source/drain region.

10. An image sensor, comprising:
a substrate having a first surface;
a first device isolation region in the substrate and adjacent to the first surface of the substrate, the first device isolation region defining a unit pixel;
a sub-isolation region on the unit pixel in the substrate, wherein the sub-isolation region is spaced apart from the first device isolation region and separates the unit pixel into a first sub-pixel and a second sub-pixel;
a first sub-transfer gate on the first surface of the substrate, adjacent to a first corner of the first sub-pixel, wherein the first corner of the first sub-pixel is adjacent to the second sub-pixel;
a second sub-transfer gate on the first surface of the substrate, adjacent to a second corner of the second sub-pixel, wherein the second corner of the second sub-pixel is adjacent to the first sub-transfer gate;
a floating diffusion region in the substrate and adjacent to the first sub-transfer gate and the second sub-transfer gate; and
a first impurity doped region in the substrate and overlapping the first and second sub-transfer gates,
wherein the first device isolation region and the sub-isolation region are spaced apart from the floating diffusion region,
wherein the substrate, the first device isolation region, and the first impurity doped region are doped with impurities having a first conductivity, and
wherein a first impurity concentration of the first impurity doped region is greater than a second impurity concentration of the substrate and less than a third impurity concentration of the first device isolation region.

11. An image sensor, comprising:
a substrate having a first surface;
a first device isolation region in the substrate and adjacent to the first surface of the substrate, the first device isolation region defining a unit pixel;
a sub-isolation region on the unit pixel in the substrate, wherein the sub-isolation region is spaced apart from the first device isolation region and separates the unit pixel into a first sub-pixel and a second sub-pixel;
a first sub-transfer gate on the first surface of the substrate, adjacent to a first corner of the first sub-pixel, wherein the first corner of the first sub-pixel is adjacent to the second sub-pixel;
a second sub-transfer gate on the first surface of the substrate, adjacent to a second corner of the second sub-pixel, wherein the second corner of the second sub-pixel is adjacent to the first sub-transfer gate;
a floating diffusion region in the substrate and adjacent to the first sub-transfer gate and the second sub-transfer gate; and
a second device isolation region below the floating diffusion region and doped with impurities having a first conductivity,
wherein the first device isolation region is doped with impurities having the first conductivity,
wherein the first device isolation region and the sub-isolation region are spaced apart from the floating diffusion region, and
wherein a second impurity concentration of the second device isolation region is equal to a first impurity concentration of the first device isolation region.

12. The image sensor of claim 11, wherein the second device isolation region contacts the first device isolation region.

\* \* \* \* \*